United States Patent
Hshieh et al.

[19]

[11] Patent Number: 5,930,630
[45] Date of Patent: Jul. 27, 1999

[54] METHOD FOR DEVICE RUGGEDNESS IMPROVEMENT AND ON-RESISTANCE REDUCTION FOR POWER MOSFET ACHIEVED BY NOVEL SOURCE CONTACT STRUCTURE

[75] Inventors: Fwu-Iuan Hshieh, Saratoga; Kong Chong So; Danny Chi Nim, both of San Jose, all of Calif.

[73] Assignee: MegaMOS Corporation, San Jose, Calif.

[21] Appl. No.: 08/899,186

[22] Filed: Jul. 23, 1997

[51] Int. Cl.$^6$ ............................................. H01L 21/336
[52] U.S. Cl. ............................................ 438/268; 438/307
[58] Field of Search .................................. 438/138, 156, 438/268, 273, 307, 529, 545

[56] References Cited

U.S. PATENT DOCUMENTS

| | | | |
|---|---|---|---|
| 5,119,153 | 6/1992 | Korman et al. | 257/341 |
| 5,250,449 | 10/1993 | Kuroyanagi et al. | 438/268 |
| 5,286,586 | 2/1994 | Mukherjee et al. | 257/341 |
| 5,460,986 | 10/1995 | Tam et al. | 438/268 |
| 5,663,079 | 9/1997 | Blanchard | 438/268 |

*Primary Examiner*—Chandra Chaudhari
*Attorney, Agent, or Firm*—Bo-In Lin

[57] ABSTRACT

The invention discloses method for fabricating a MOSFET on a substrate to improve device ruggedness. The method includes steps of: (a) forming an epi-layer of a first conductivity type as a drain region on the substrate and growing an initial oxide layer over the epi-layer; (b) applying an active mask for etching the active layer to define an active area followed by depositing an overlaying polysilicon layer and applying a polysilicon mask for etching the polysilicon layer to define a plurality of polysilicon gates; (c) removing the mask and carrying out a body implant of a second conductivity type followed by performing a body diffusion for forming a plurality of body regions; (d) applying a source blocking mask for implanting a plurality of source regions in the body regions with ions of the first conductivity type followed by removing the blocking mask and a source diffusion process; (e) forming an overlying insulation layer covering the MOSFET followed by applying a contact mask to open a plurality of contact openings; (f) performing a low energy body-dopant and high energy body dopant implant to form a shallow high-concentration body dopant and a deep high-concentration body dopant region followed by applying a high temperature process for densification of the insulation layer and activating diffusion of the deep and shallow body dopant regions wherein the deep high-concentration body-dopant regions are formed below the source regions and extends beyond the contact regions but are kept at lateral distance away from a channel region of the MOSFET in the body region whereby device ruggedness is improved without increasing threshold voltage.

7 Claims, 13 Drawing Sheets

5,930,630

METHOD FOR DEVICE RUGGEDNESS IMPROVEMENT AND ON-RESISTANCE REDUCTION FOR POWER MOSFET ACHIEVED BY NOVEL SOURCE CONTACT STRUCTURE

BACKGROUND OF THE INVENTION

1. Field of the Invention

This invention relates generally to the cell structure and fabrication process of vertical power transistors. More particularly, this invention relates to device ruggedness improvement and on resistance reduction by implementing a novel source contact structure and fabrication process.

2. Description of the Prior Art

For the purpose of improving the device ruggedness, limitations of higher fabrication cost and product reliability concerns still exist in the manufacture of power MOSFET transistors of shallower junctions. In order to achieve higher device ruggedness, a more complicate processes are often applied. These processes involve either the use of an extra implant mask to form a buried body implant region under the source region or the formation of spacer. The gate sidewall spacer is often applied which employs an oxide spacers to form the self aligned buried regions underneath the source regions with higher body-dopant concentration. In carring out the processing steps to form these oxide spacers, a special anisotropic etching process, e.g., a reactive ion etching (RIE), process is performed which often leads to special problems and limitations in manufacturing the power device. Leakage of the junction currents, directly below the space edges is often reported in device formed with oxide spacer. The problems can be attributed to silicon loss and spacer etch damages in the substrate which also lead to defects formed in the subsequent source implant and anneal. The performance of the power device and the reliability are therefore adversely affected due to these difficulties when spacers are implemented which are formed with these processing steps. Another problem is related to the gate oxide integrity. After the buried body implant, the oxide spacer is removed with a wet etch for subsequent source implant. The wet etch process results in cavities at the edge of the polysilicon gate. The cavities are not refilled during subsequent source diffusion process due to the time of diffusion is not sufficient to cause enough growth of the silicon oxide to refill the cavities. For high density MOSFET device, the cavities on edges of the gate is a more sever problem because a very short source diffusion is usually carried out to avoid deep junctions when longer source diffusion is performed.

In spite of these difficulties, a designer is nevertheless faced with a constant challenge to increase the device ruggedness due to the fact that various internal parasitic components often impose design and performance limitations on a conventional power metal oxide silicon field effect transistor (MOSFET). Among these parasitic components in a MOSFET transistor, special care must be taken in dealing with a parasitic npn bipolar junction transistor (BJT) formed between the source, the body, and the drain. Under normal static conditions the base and emitter of the parasitic BJT are shorted, leaving only the body-drain diode effective. However, in a transient conditions and during an avalanche breakdown, the parasitic BJT may be activated incidentally which can seriously degrade the overall performance of the MOSFET. Under the circumstances when the parasitic bipolar junction transistor is incidentally activated, snap back may occur which can cause permanent damages to the device. For this reason, precaution must be taken to increase the ruggedness of the device by taking into account that an incidental activation of the parasitic BJT should be prevented in an avalanche breakdown condition when large amount of hole current is generated in the core cell area.

In order to better understand the design issues related to device ruggedness encountered in the prior art, general descriptions for the structure of a conventional power MOSFET device and design issues relating to device ruggedness are first discussed. FIG. 1 shows a typical vertical double diffused MOS (VDMOS) device which uses a double diffusion technique to control the channel length l. Two successive diffusions are performed with first a p diffusion using boron, then a n diffusion using either arsenic or phosphorus, to produce two closely spaced pn junctions at different depths below the silicon surface. With this pn junction, as shown in FIG. 1, the VDMOS supports the drain voltage vertically in the $n^{31}$ epitaxial layer. The current flows laterally from the source through the channel, parallel to the surface of the silicon. The current flow then turns through a right angle to flow vertically down through the drain epitaxial layer to the substrate and to the drain contact. The p-type "body" region in which the channel is formed when a sufficient positive voltage is applied to the gate. the channel length can be controlled through the processing steps. Because of the relative doping concentrations in the diffused p-channel region and the n– layer, the depletion layer which supports $V_{DS}$, a drain to source voltage, extends down into the epitaxial layer rather than laterally into the channel. Under the circumstances of avalanche breakdown, a hole current, i.e., $I_h$ as shown in FIG. 1, is generated to flow from the breakdown region to the source. A voltage drop, $I_h R_b$, is generated over the parasitic NPN bipolar junction transistor as the hole current $I_h$ is transmitted via the p-body region underneath which has a p-body resistance $R_b$. When this voltage drop across this parasitic bipolar junction transistor reaches a certain level, e.g., 0.7 volts, the parasitic bipolar transistor is turned on. Activation of the parasitic bipolar transistor, as discussed above, could cause snap-back and permanent damages to the MOSFET device.

For the purpose of improving the device ruggedness, Motorola discloses in Electronic Engineering Times, Apr. 8, 1996, Page 78, a HDTMOS-2 structure. In that structure, after the $n^+$ source implant, a dielectric layer is grown on top of the polysilicon gate. The dielectric layer is etched to form the gate sidewall spacers for boron implant blocks, which are automatically self aligned with the source regions. This heavily doped $p^+$ region underneath the source region can reduced the body to source resistance $R_b$ in the p-body region thus decreasing the voltage drop $I_h R_b$ whereby the ruggedness of the MOSFET device is improved. However, additional difficulties arise from this spacer implementation. In order to fabricate the side-wall spacers, an anisotropic etch process is typically applied to remove the oxide in the flat areas while leaving the spacers at the side walls of the polysilicon gates. In order to account for variations in the spacer oxide layer thickness, some over etch is necessary. During the over-etch time, the field oxide and the silicon in the source or body junction regions may also be etched. Which may lead to the problems and difficulties discussed above. Furthermore, the uniformity of a reactive ion etch (RIE) process is difficult to control and the slope of the spacer may vary along the side-walls of the polysilicon gates. Which may then affect the self alignment and dopant profiles in subsequent ion implant operations to form the buried body-regions and the source regions. These difficulties in applying the RIE process cannot be easily resolved when the spacers are employed.

In order to reduce the body to source resistance, Korman et al. disclosed in U.S. Pat. No. 5,119,153 entitled "Small Cell Low Contact Resistance Rugged Power Field Effect Devices and Method of Fabrication" (issued on Jun. 2, 1992), a power field effect semiconductor device wherein an oxide or nitride spacer is used to form a heavily doped portion of a body region which is self aligned with respect to an aperture in the gate electrode. In forming the spacer, the nitride or oxide layer has to be formed and then anisotropically etched by reactive ion etching (RIE) in order to form the space along the side wall of the polysilicon silicon gate. Therefore, the device disclosed by Korman et al. is faced with the same technical difficulties associated with an-isotropic etching, such as an RIE process, as discussed above. Difficulties in manufacturability arising from imprecision of process control in applying this RIE method may also cause the cost of production to increase.

In yet another U.S. Pat. No. 5,268,586, entitled "Vertical Power MOS Device with Increased Ruggedness and Method of Fabrication", (issued on Dec. 7, 1993) Mukherjee et al. disclose a semiconductor device with improved ruggedness by forming a second body region, i.e., a second base region, within the first body region, under the source regions. As shown in a cross sectional view of FIG. 2A, the second body region is shallower than the first body region and is formed close to the channel region to reduce the parasitic resistance in the first body region. The lateral edges of the second body region are substantially aligned with the lateral edges of the gate electrode. The first body region and the source region are formed by sequential implantation through the polysilicon gate electrode using the polysfficon gate electrode as a self aligned mask. The second body region is then formed by body implantation, again, using the polysfficon gate as the implant mask, without substantial lateral diffusion. Since the second body region is formed without substantial lateral diffusion, very limited thermal budget is allowed for the this second body region. Reduction of the drain to source resistance is quite limited because, without enough diffusion process, this second body region is formed with reduced depth under the source regions. Furthermore, high contact resistance between the metal and the body region may occur due to a low P+ surface doping concentration as the net dopant concentration as a function of depth along the line F-F' shown in FIG. 2B. Additional difficulties of higher threshold voltage may also arise from lateral diffusion of the second body region to touch the channel region. Finally, a polysilicon layer of greater thickness employed in this structure may cause another problem. For high density DMOS device, poor metal coverage may occur when the re-firing of the thicker polysilicon layer to block the high energy body implant ions causes the contact openings to have high aspect ratio, i.e., high height to width ratio.

Therefore, there is still a need in the art of power device fabrication, particularly for power MOSFET design and fabrication, to provide a simplified and improved fabrication process that would resolve these limitations.

SUMMARY OF THE PRESENT INVENTION

It is therefore an object of the present invention to provide a new and novel MOSFET cell structure, and fabrication process to form the self aligned deep and shallow high-concentration body-dopant regions to improve the device ruggedness and to remove a top portion of the lightly doped source region to reduce the contact resistance whereby the aforementioned limitations encountered in the prior art can be overcome.

Specifically, it is an object of the present invention to provide a new and improved MOSFET manufacture process and cell structure by performing the shallow and deep p+ body implant operations after the contact opening process wherein the thick insulation layers covering the gates are employed as ion-blocks for body implants to form the self-aligned deep and shallow p+ body regions and followed by removing the lightly doped n+ surface portion as the result of doping compensation form the p+ body implants in the contact openings whereby the contact resistance is reduced.

Another object of the present invention is to provide a new and improved MOSFET manufacture process and cell structure by performing the shallow and deep p+ body implant operations after the contact opening process wherein the thick insulation layers covering the gates are employed as ion-blocks for body implants to form the self-aligned deep and shallow p+ body regions and a high energy ion implant to form the deep p+ body region is performed either without an implant oxide or with an implant angle less than seven degrees (7°), e.g., at zero degree, from a perpendicular direction to the substrate surface, in order to form a deeper channeling-enhanced high concentration body dopant profile in the body region to further improve the device ruggedness.

Another object of the present invention is to provide a new and improved MOSFET manufacture process and cell structure by performing the shallow and deep body implant operations after the contact opening process wherein the thick insulation layers covering the gates are employed as ion-blocks for body implants to form the self-aligned deep and shallow high concentration body regions whereby the requirement of additional masks or sidewall spacers as that employed in the prior art are no longer necessary and higher product quality and reliabffity can be achieved with this simplified manufacture process.

Another object of the present invention is to provide a new and improved MOSFET manufacture process and cell structure by performing the shallow and deep body implant operations after the contact opening process wherein the thick insulation layers covering the gates are employed as ion-blocks for body implants to form the self-aligned deep and shallow body regions wherein the p+ body-dopant regions are kept at a certain lateral distance away from the channel regions by taking advantage of the thickness of the insulation layers applied as ion blocks whereby the concerns of threshold voltage increase caused by lateral diffusion of the body dopant to the channel regions as that encountered in the prior art are eliminated.

Briefly, in a preferred embodiment, the present invention discloses an improved method for fabricating a MOSFET transistor on a substrate to improve a device ruggedness. The fabrication method includes the steps of: (a) forming an epi-layer of a first conductivity type as a drain region on the substrate and then growing an initial oxide layer over the epi-layer; (b) applying an active mask for etching the active layer to define an active area followed by depositing an overlaying polysilicon layer thereon and applying a polysilicon mask for etching the polysilicon layer to define a plurality of polysilicon gates; (c) removing the polysilicon mask and then carrying out a body implant of a second conductivity type followed by performing a body diffusion for forming a plurality of body regions; (d) applying a source blocking mask for implanting a plurality of source regions in the body regions with ions of the first conductivity type followed by removing the source blocking mask and a source diffusion process; (e) forming an overlying insulation layer covering the MOSFET device followed by applying a contact mask to open a plurality of contact openings there-through; (f) performing a low energy body-dopant implant and high energy body dopant implant to form a shallow high-concentration body dopant region and a deep high-concentration body dopant region followed by applying a high temperature process for densification of the insulation layer and for activating a diffusion of the deep and shallow body dopant regions wherein the deep high-concentration body-dopant regions are formed below the source regions and extends beyond the contact regions but are kept at lateral distance away from a channel region of the MOSFET device in the body region whereby the device ruggedness is improved without the concern of increasing the threshold voltage.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
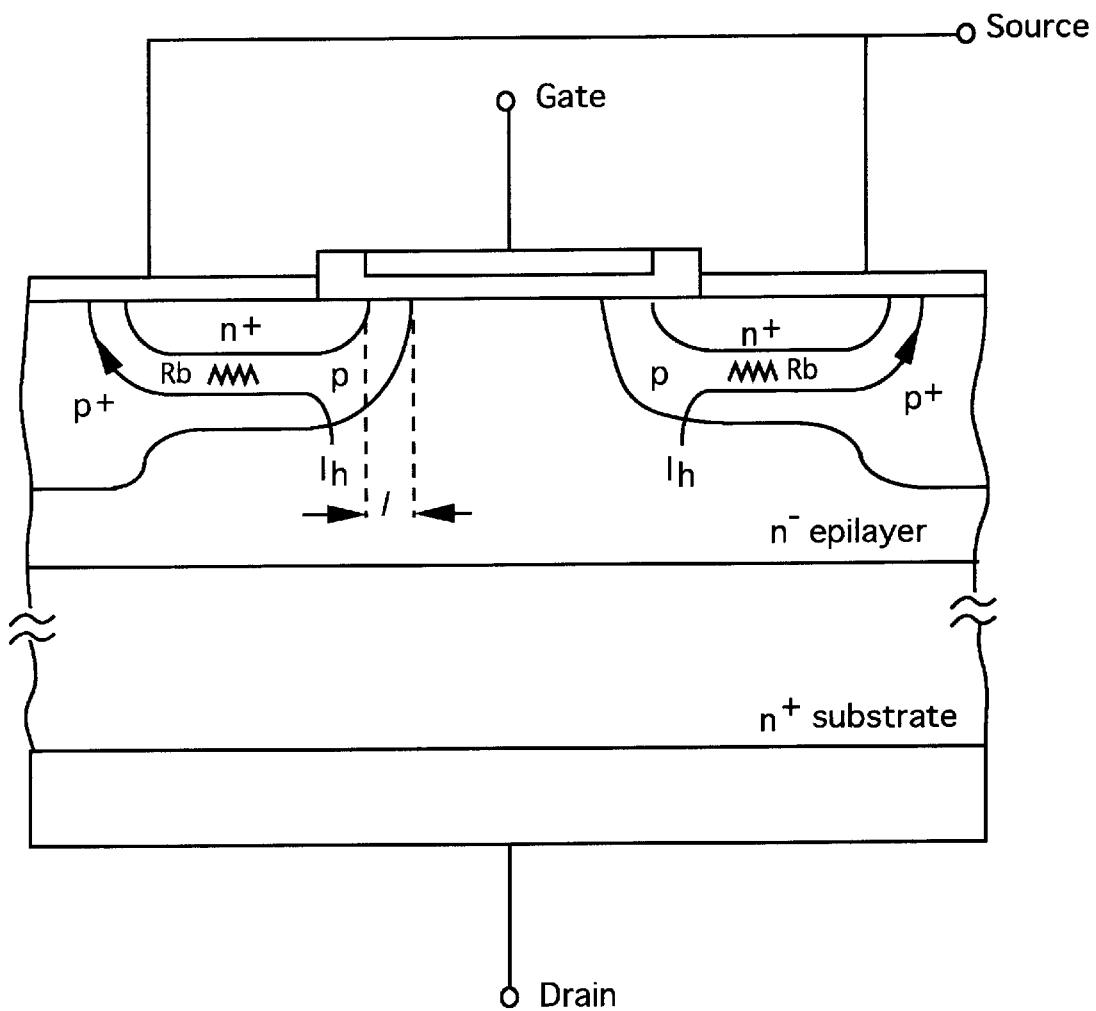
FIG. 1 is a cross-sectional view of a prior art structure of a general MOSFET.
Figure 2A:
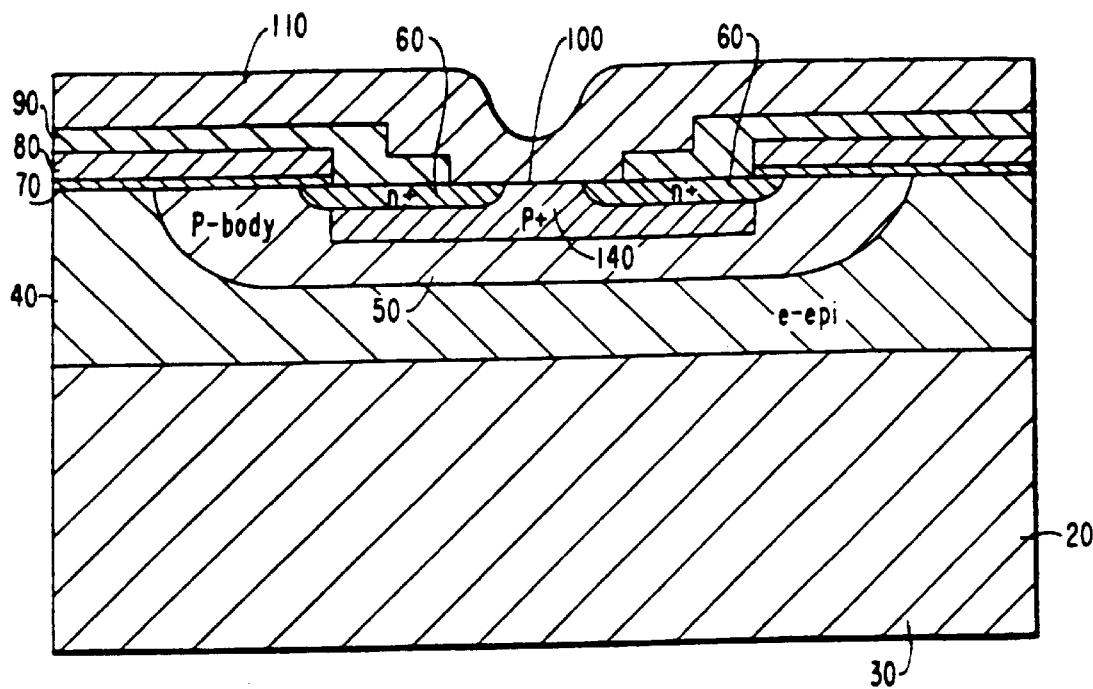
FIGS. 2A is a cross-sectional view of another prior art MOSFET structure with a heavily doped body region underneath the source implanted by using the gate as dopant blocks without diffusion and aligned substantial with the edges of the gate to improve the device ruggedness.
Figure 2B:
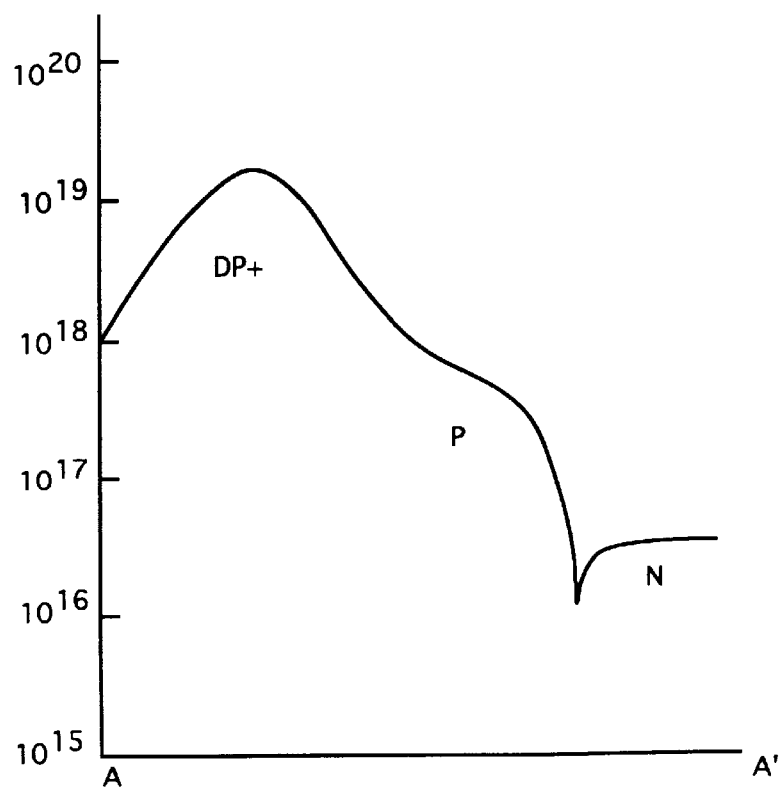
FIG. 2B shows the variation of the net dopant concentration as a function of the depth along a line F-F' of the MOSFET of FIG. 2A.
Figure 3A:
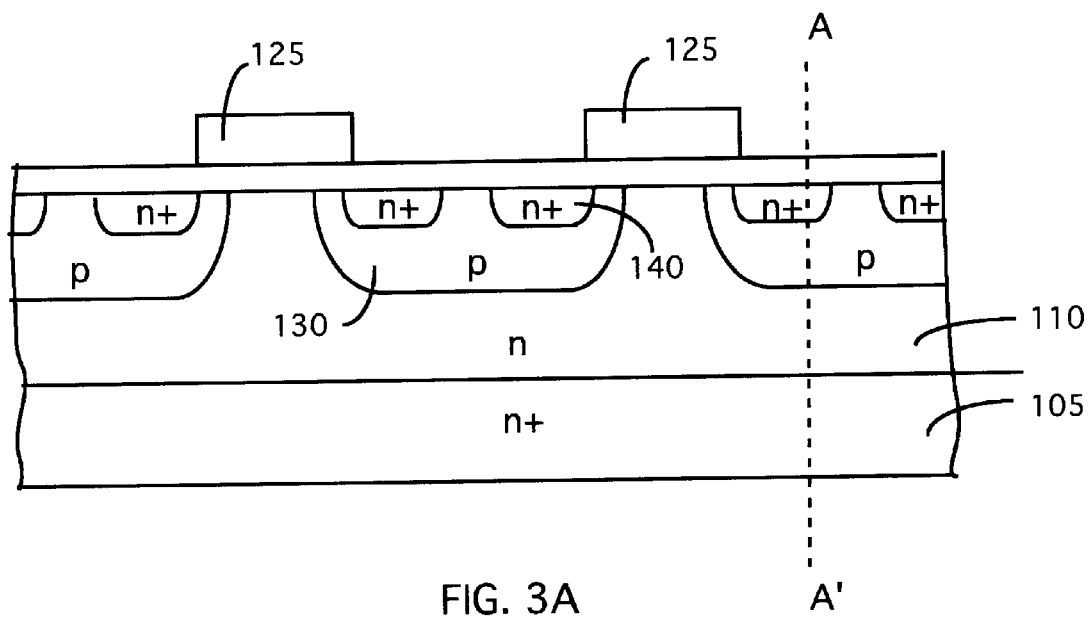
FIGS. 3A to 3D show the cross sectional views of the active area of a MOSFET transistor at different major stages for manufacturing a MOSFET device of the present invention with a high concentration shallow body region, and a deep heavily doped body-region formed underneath the source.
Figure 3B:
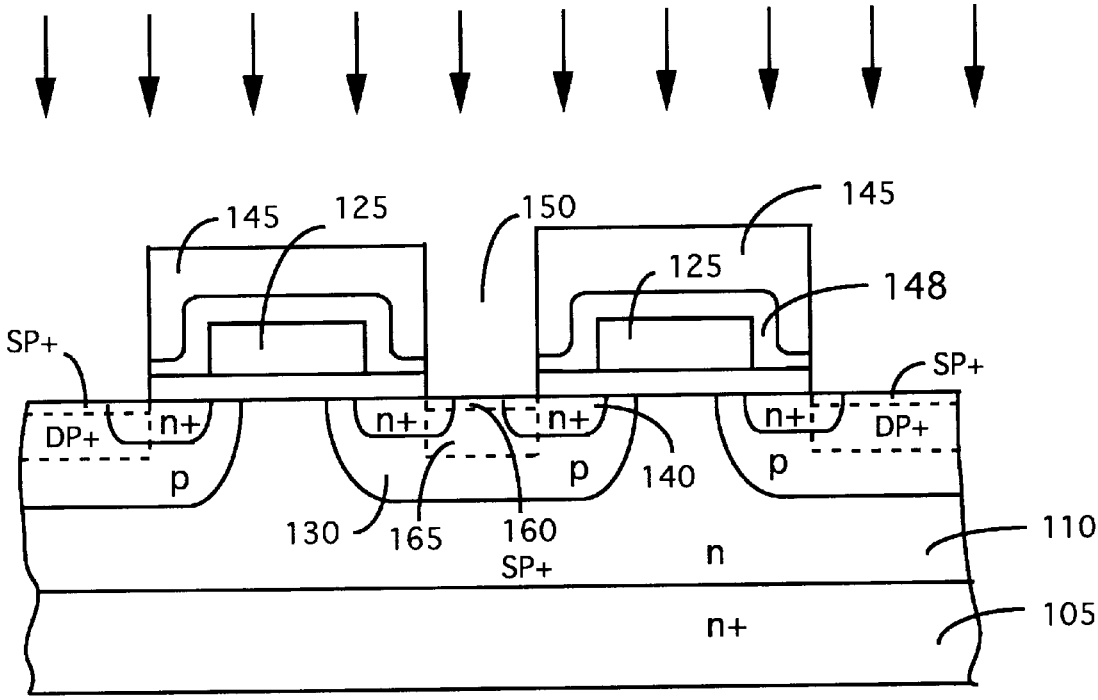
Figure 3C:
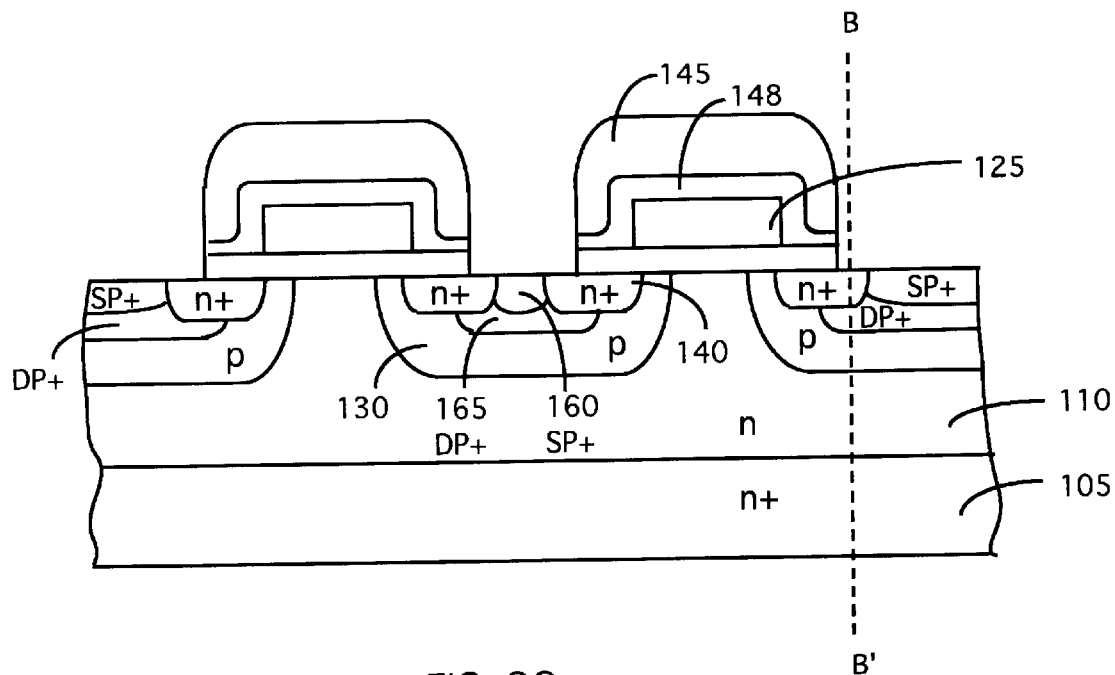
Figure 3D:
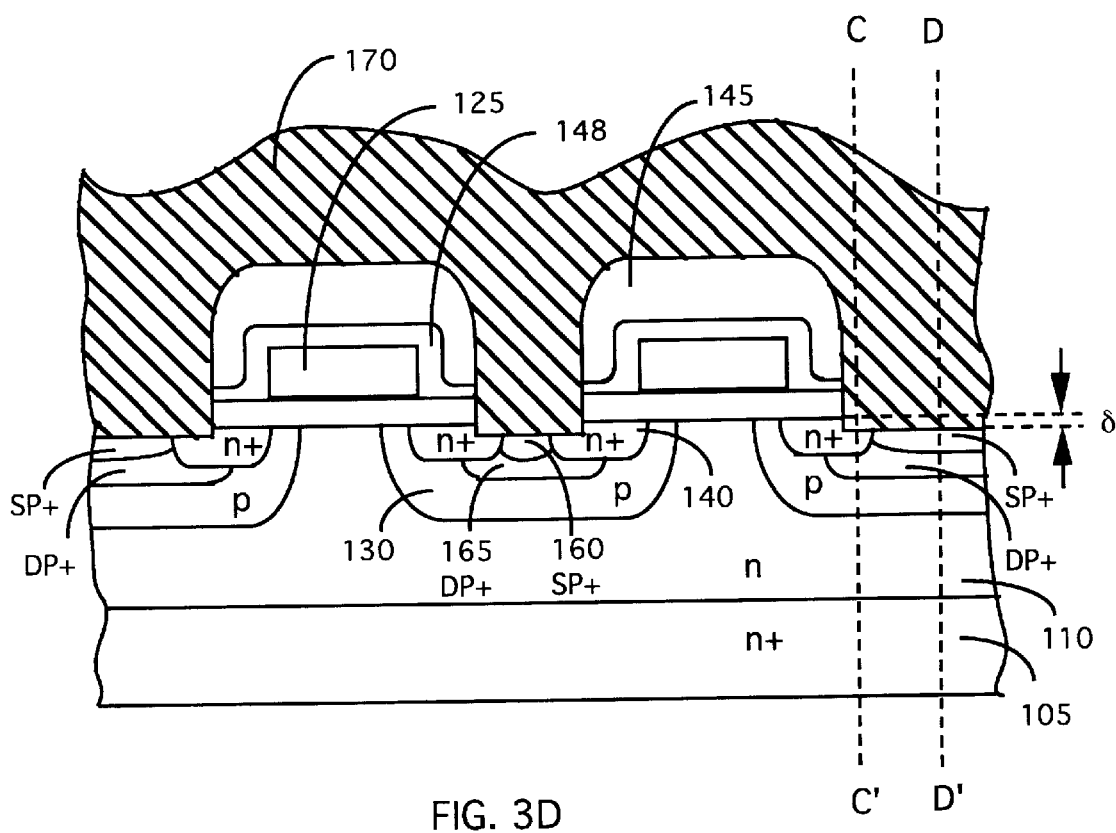

Please refer to FIGS. 3A to 3D for the novel processing steps to manufacture a power MOSFET device to increase the device ruggedness and to reduce the contact resistance according to the present invention. Started from FIG. 3A, the processing steps are described after the source diffusion process are completed to illustrate the major features of the present invention. More details for the manufacture processes will be discussed below in FIGS. 5A to 5E. Referring to FIG. 3B, a first insulation layer 148 comprising preferably NSG or PSG insulation layer is formed. A second insulation layer 145 comprising preferably a BPSG insulation layer is formed over the top. A contact mask (not shown) is applied to open a plurality of contact openings 150 through the first and second insulation layers 145 and 148. These contact openings 150 are applied here as the low energy and high energy high concentration body implant windows. A low energy implant body implant with boron or $BF^2$ is first carried out to form the shallow high concentration body region 160 near the top surface of the contact openings 150. A high energy body implant with boron ions is performed to form the deep high concentration body region 165. Referring to FIG. 3C, a BPSG reflow is performed where the profile of the second insulation layer 145, e.g., a BPSG layer, are changed to a smooth profile as shown. In the meantime, the elevated temperature applied to carry out the BPSG reflow also activate the diffusion of the shallow and deep high concentration body regions 160 and 165 respectively. Referring to FIG. 3D, after the BPSG reflow process, a contact silicon etch is performed to remove a portion from the top surface of the contact openings. As shown in FIG. 3D, the top portion removed has a depth of δ. After the top layer of thickness δ is removed, a layer of source contact metal 170 is formed over the top.

Figure 4A:
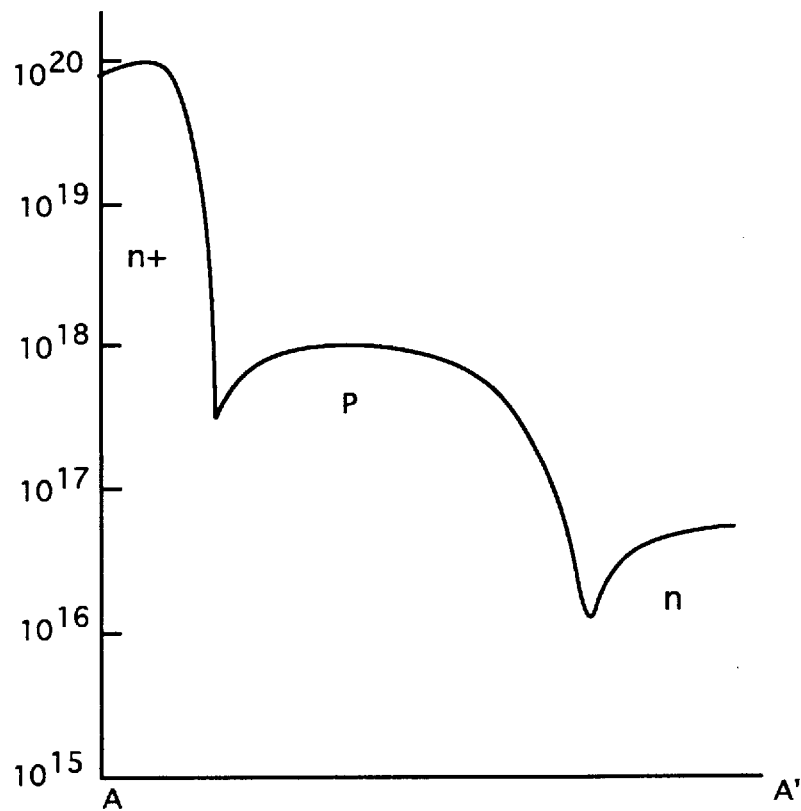
FIGS. 4A to 4F are a series of net dopant concentration profiles during different stages of the manufacturing processes.
Figure 4B:
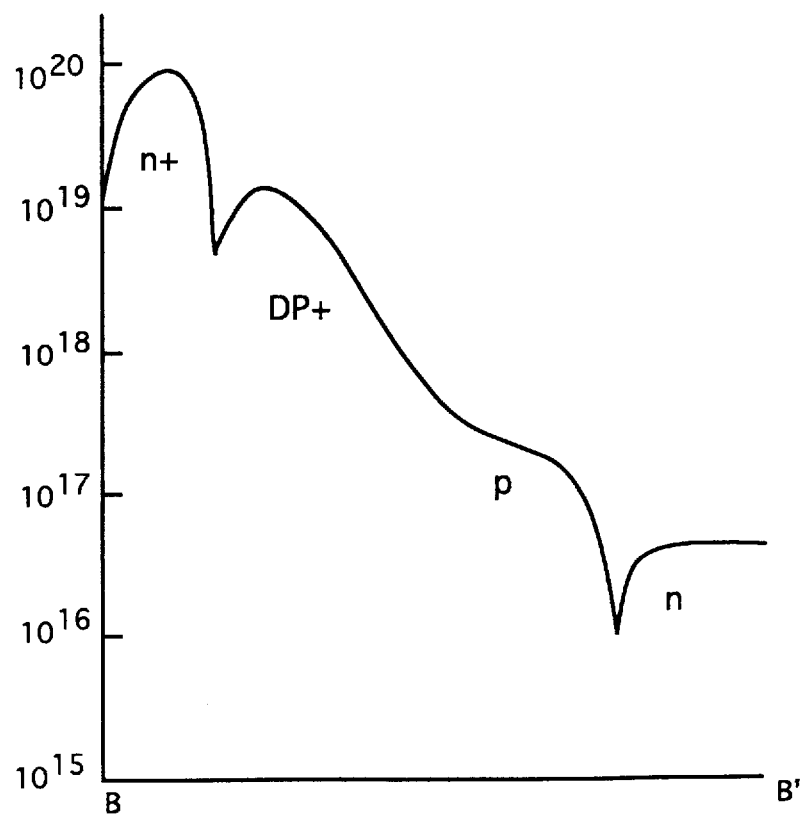
Figure 4C:
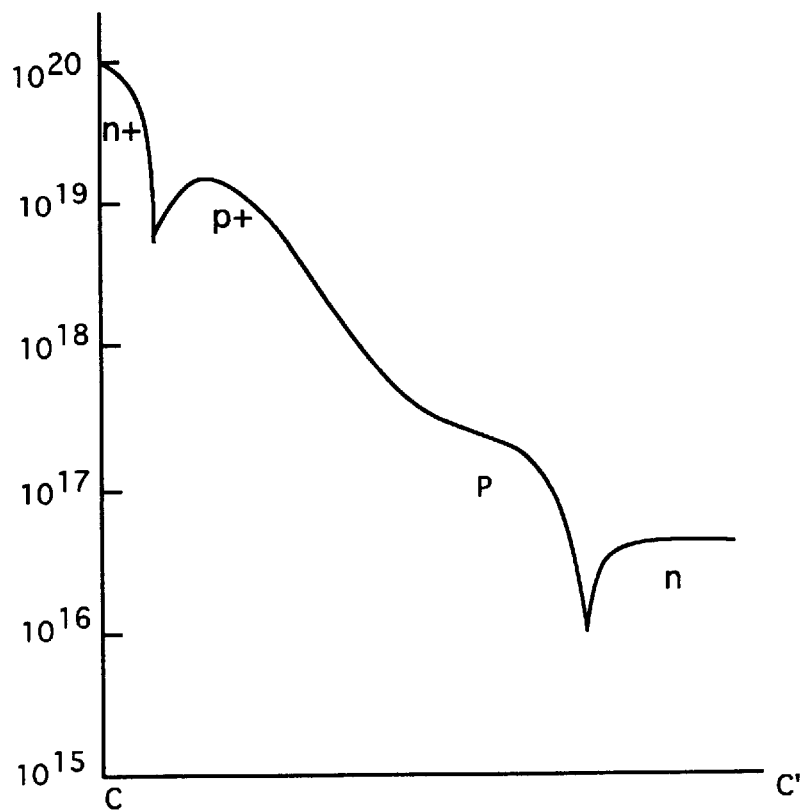
Figure 4D:
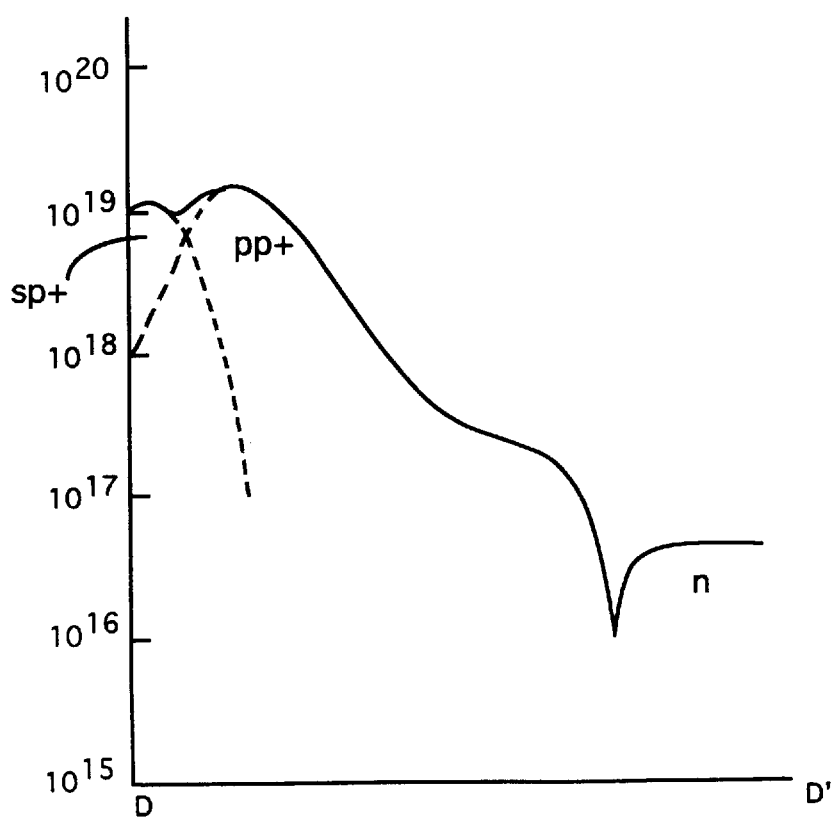
Figure 4E:
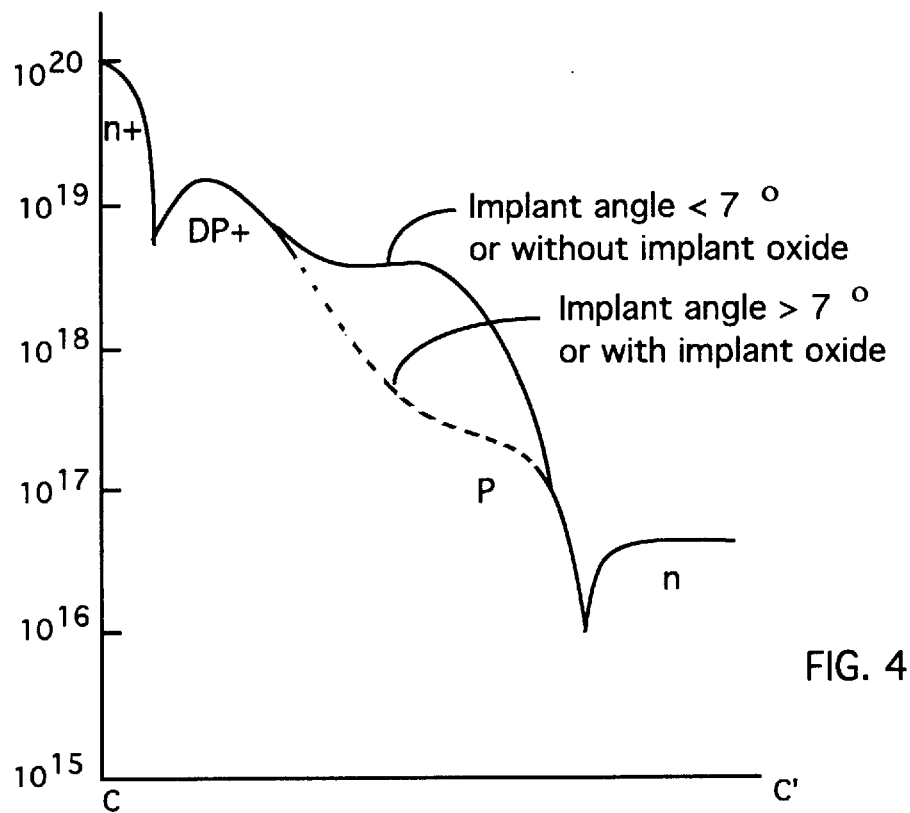
Figure 4F:
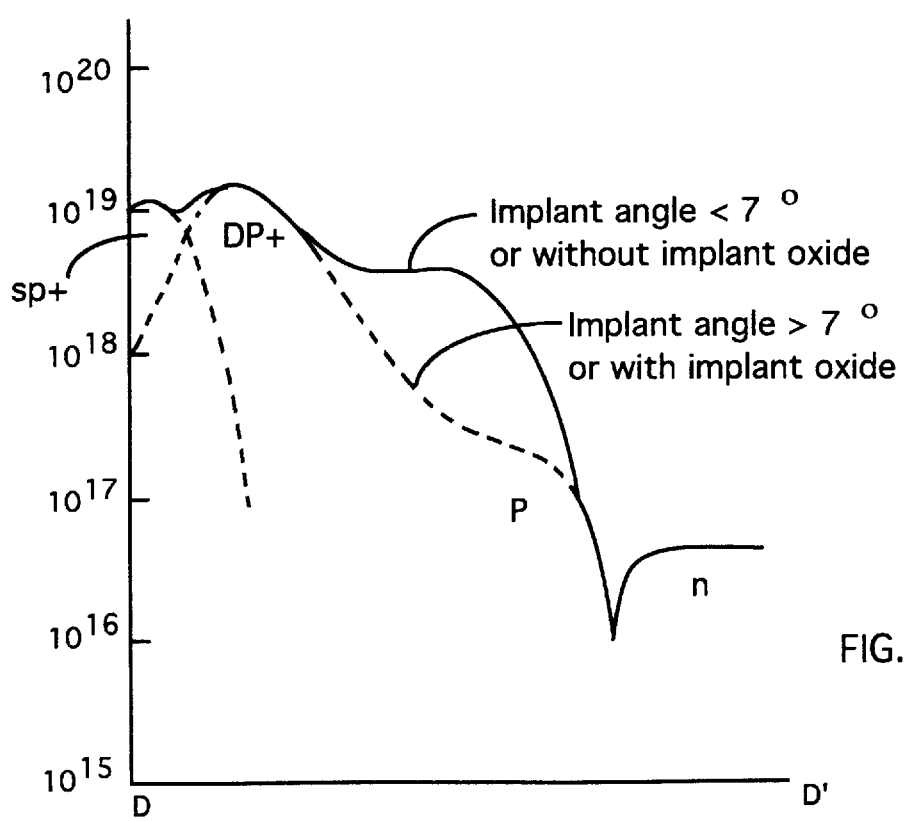

The advantages of the present invention can be appreciated by referring to the net dopant concentration profiles as shown in FIGS. 4A to 4F. In FIG. 4A, a net dopant concentration along line A-A' of FIG. 3A is shown. This net dopant concentration profile is a typical profile without having a deep high concentration body dopant region. Referring to FIG. 4B, along the line B-B' in FIG. 3C, a deep P+ region 165 (DP+) is formed. In the meantime, the source ion concentration at the top surface near point B is decreased. This is caused by the compensation of the implant of the shallow high concentration body region 160 which reduces the net source ion concentration near the top surface of the source regions 140. Referring to FIGS. 4C and 4D along the lines C-C' and D-D' in FIG. 3D. After the top layer of thickness δ is removed, the portion of the source region 140 which has lower net dopant concentration is removed. Thus the difficulty of higher contact resistance caused by a lower net source dopant concentration at the top surface due to the shallow p+ body implantation is removed. Referring to FIG. 4D, the contact resistance in shallow p+ region 160 is also improved. Furthermore, the device ruggedness is improved with a deep P+ body region 165 formed underneath the source region 140. FIGS. 4E and 4F are the net dopant concentration profiles along lines C-C' and D-D' respectively which are further improved when the deep body implant is carried out by taking advantage of a channeling effect by either skipping the process of growing a layer of implant oxide or by arranging an implant angle smaller than a regular implant angle of seven degrees, i.e., 7° relative to the perpendicular direction to a top surface of the substrate. It is a general industry practice to grow an implant oxide to prevent implant damage. As the activation temperature employed in this invention is kept at a relatively low level to avoid a stacking fault induced by a higher temperature during the activation process, thus the process of growing an implant oxide layer may be skipped to obtain the benefit of further improved device ruggedness with a channeling enhanced profile. By implanting either without an oxide layer or by implanting the deep high concentration body region with implant angle less than 7°, the body dopant ion can penetrate through a greater depth into the body region without being scattered by either the implant oxide or the particles in the lattice structure. The greater body dopant concentration beneath the deep body implant region 165 further improve the ruggedness of the device. Because this higher body dopant concentration deep down in the body region serve the purpose of further reducing the resistance in the lower body region. The likelihood of incidentally turning on the parasitic bipolar transistor due a voltage drop across that region is therefore further reduced.

Figure 5A:
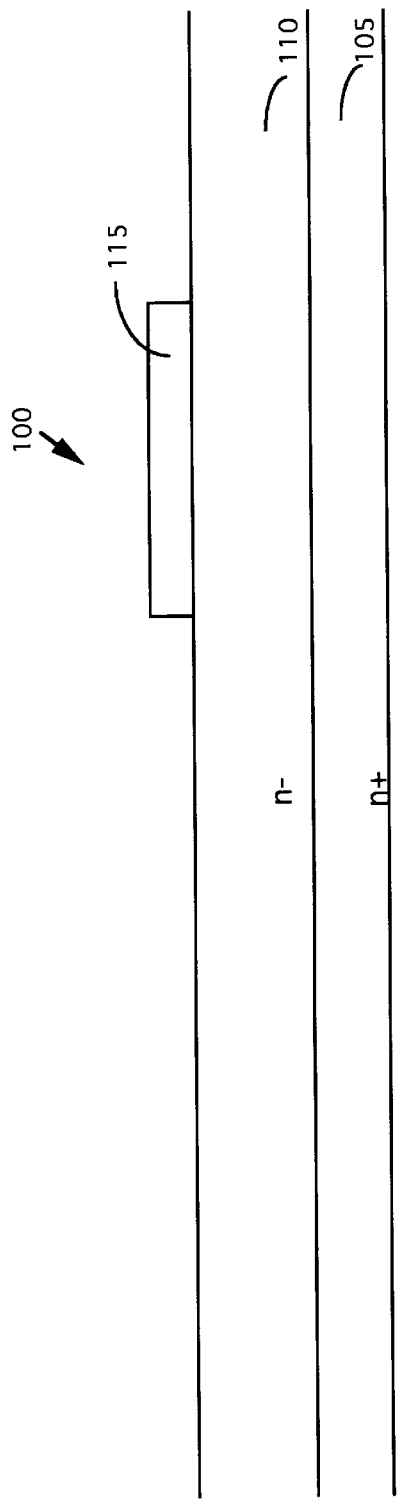
FIGS. 5A to 5F show the detail processing steps of manufacturing the MOSFET device of this invention.
Figure 5B:
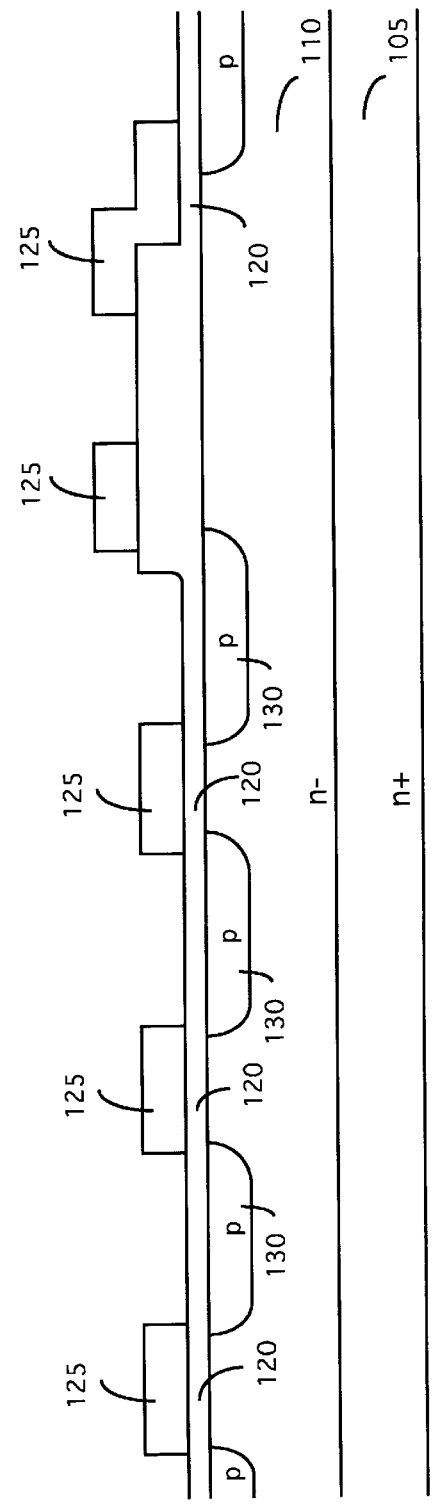

Referring to FIGS. 5A to 5F for the processing steps employed to manufacture the MOSFET device of the present invention. The process begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaidal layer 110 depend on the requirements for device on-resistance and breakdown voltage. In a preferred embodiment, the thickness of the epi-layer 110 is about six to eight microns (6–8 $\mu$m). An initial oxide layer 115 of thickness in the range of 5,000 to 10,000 Å is grown which is then etched by applying a mask to define the active areas. In FIG. 5B, a gate oxidation process is first carried out to form a gate oxide layer 120. A polysilicon layer 125 is then deposited on the gate oxide layer 120. A POCL$_3$ doping process is carried out followed by an arsenic (As) implant process with an ion beam of energy at 60–80 Kev with a flux density of 5 to $8\times10^{15}/cm^2$. A polysilicon mask is then applied to carry out the an anisotropic etching process to define the polysilicon gate 125. The resist is stripped and a p-body implant at 30–100 Kev with an ion beam of $3\times10^{13}$ to $3\times10^{14}/cm^2$ flux density to form the p-body region 130. A p-body diffusion process is then carried out at an elevated temperature of 1,000–1,200° C. for ten minutes to three hours to increase the depth of the p-body region 135 to 1.0–2.0 $\mu$m.

Figure 5C:
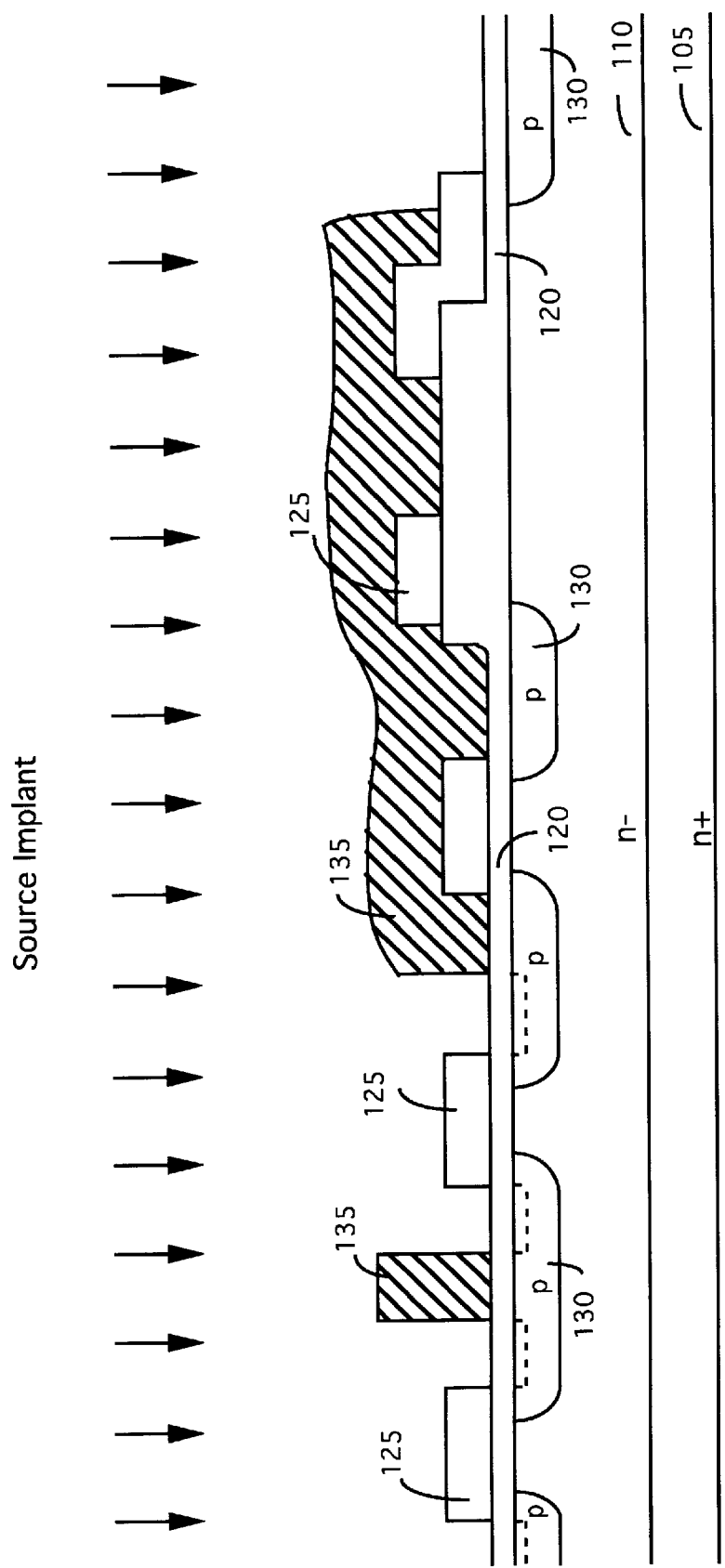
Figure 5D:
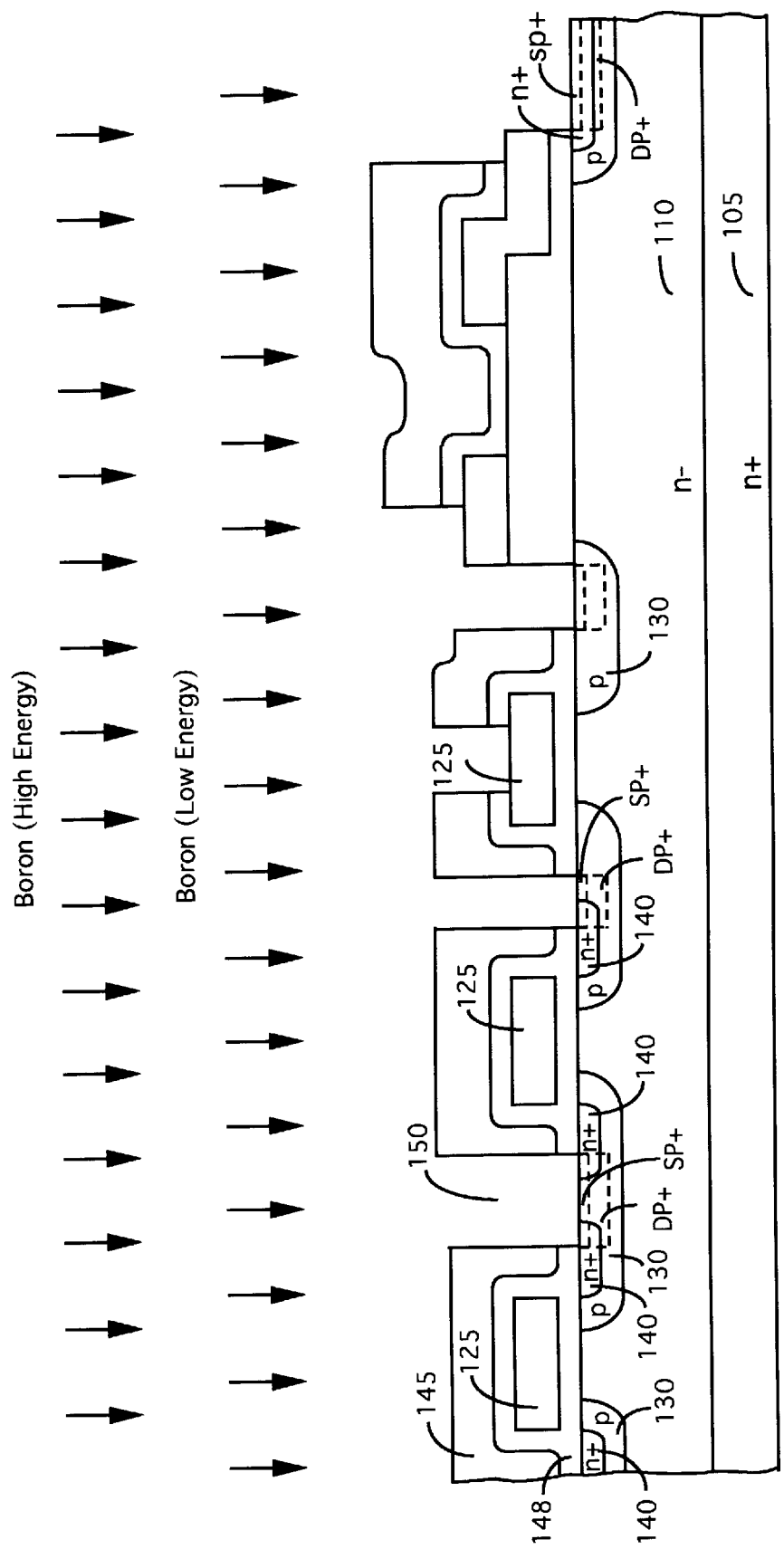

Referring to FIG. 5C, a N+ block mask 135 is applied to carry out an N$^+$ implant to form the N$^+$ region 140. The N$^+$ implantation is carried out with an ion beam at an energy of 60–100 Kev and ion flux density of $5\times10^{15}$ to $1\times10^{16}/cm^2$. After the resist is stripped, the N+ source regions 140 are driven into desired junction depth ranging from 0.2 to 1.0 $\mu$ by a diffusion process. A NSG or PSG is deposited to form a first insulation layer 148 of approximately 1000–5,000 Å in thickness. A BPSG layer is deposited to form a second insulation layer 145 of about 5,000 to 15,000 Å in thickness. Referring to FIG. 5D, a contact mask is applied to perform an etching process to define a plurality of contact windows 150. A shallow body implant is performed to form a shallow high concentration body region 160 with either a low energy boron implant with an ion flux of $1\times10^{14}$ to $2\times10^{15}/cm^2$ at about 20 to 60 Kev or a high energy BF$_2$ implant with an ion flux of $1\times10^{14}/cm^2$ to $2\times10^{15}$ at about 100–240 Kev. Then a high energy body implant is carried out by either skipping a step of grwoing an implant oxide layer or implanting with an implant angle smaller than seven degree (7°), e.g., at zero degree relative to the perpendicular direction to the top surface of the substrate, to form a deep high concentration body region 165 with boron ions of an ion flux of about $3\times10^{14}$ to $1\times10^{16}/cm^2$ at about 100 to 300 Kev. A region in the lower portion of the body region 130 with higher body dopant concentration is formed because of the channeling effect as that shown in FIGS. 4E and 4F. Further improvement of device ruggedness is achieved because of this channeling-body dopant region formed in a greater depth in the body region 130.

Figure 5E:
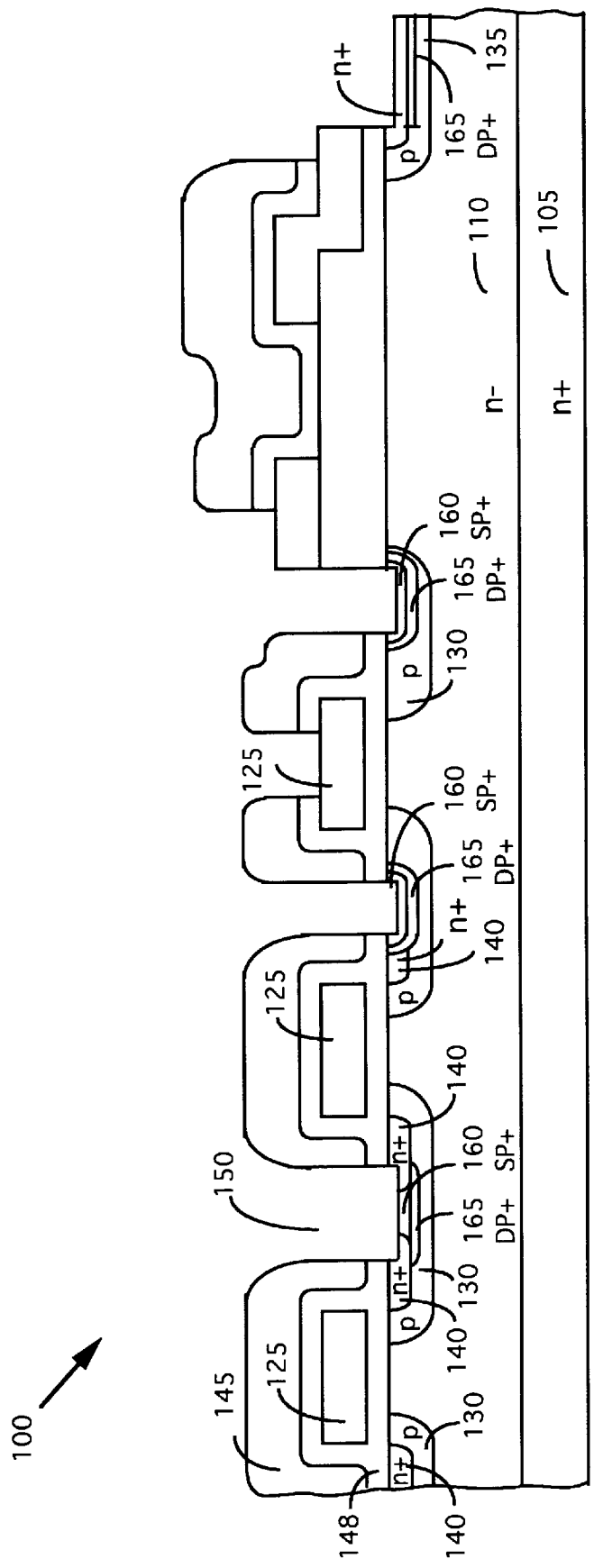
Figure 5F:
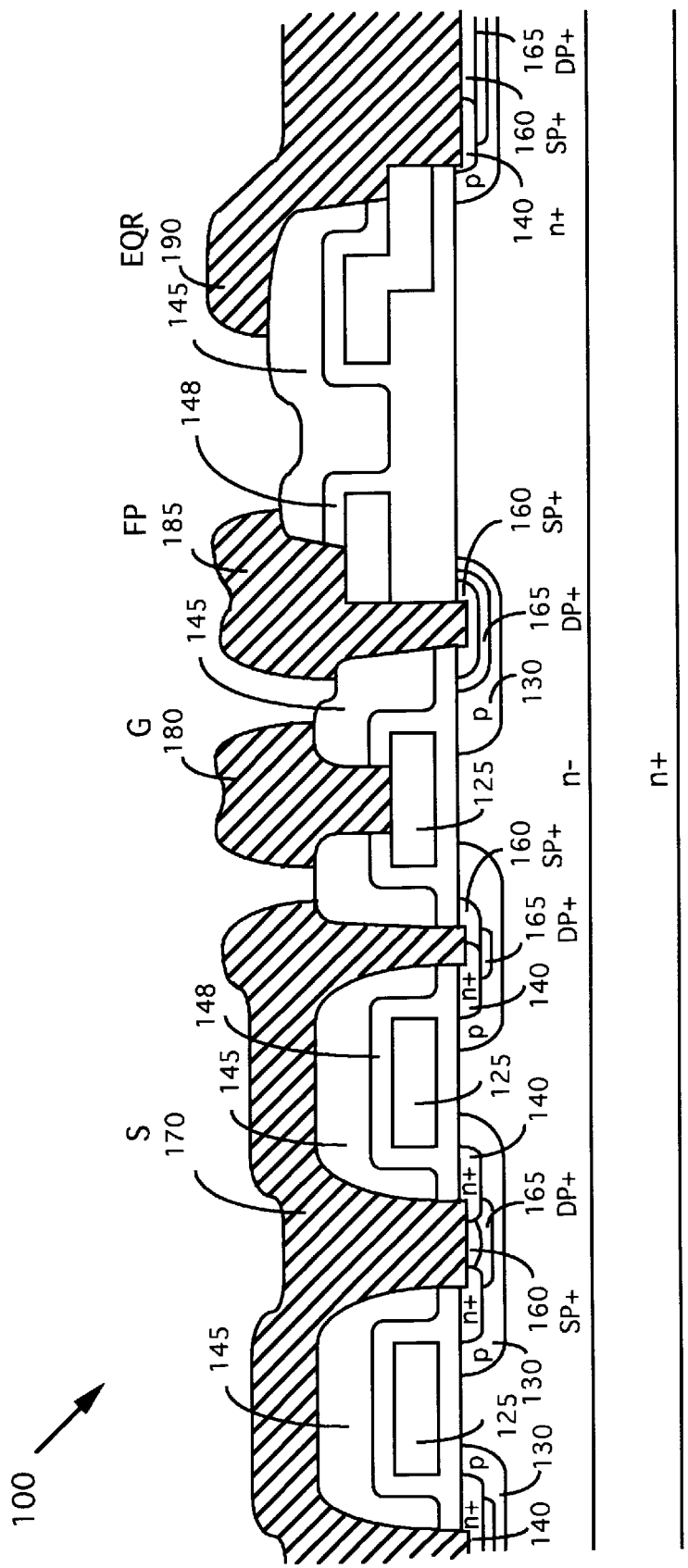

Referring to FIG. 5E, a BPSG reflow and densification process is performed at 900–950° C. for thirty minutes to one hour. The shallow body region 160 and the deep body region 165 are activated. An etch process is performed to remove a top portion of the silicon layer from the contact windows 150. The thickness 6 of the top portion removed ranging from 300 to 3,000 Å. The contact resistance between the metal contact 170 and the source region 140 is reduced with the removal of this top portion because the low net source dopant concentration of the source region 140 at the top surface caused by body dopant implant compensation is now removed.

According to FIGS. 5A to 5E and above descriptions, this invention discloses a method for fabricating a MOSFET transistor on a substrate. The method includes the steps of (a) forming an epi-layer of a first conductivity type as a drain region in the substrate and then growing an initial oxide layer over the epi-layer; (b) applying an active mask for etching the active layer to define an active area followed by depositing an overlaying polysilicon layer thereon and applying a polysilicon mask for etching the polysilicon layer to define a plurality of polysilicon gates; (c) removing the polysilicon mask then carrying out a body implant of a second conductivity type followed by performing a body diffusion for forming a plurality of body regions; (d) applying a source blocking mask for implanting a plurality of source regions in the body regions with ions of the first conductivity type followed by removing the source blocking mask and a source diffusion process; (e) forming an overlying insulation layer covering the MOSFET device followed by applying a contact mask to open a plurality of contact openings there-through; and (f) performing a low energy body-dopant implant and high energy body dopant implant to form a self-aligned shallow high concentration body dopant region and a self-aligned deep high concentration body dopant region. In a preferred embodiment, after forming the self-aligned shallow high concentration body-dopant region and the self-aligned deep high concentration body dopant region, the step (f) further includes a step of applying a high temperature process for densification of the insulation layer and for activating a diffusion of the deep and shallow high concentration body dopant regions. In a preferred embodiment, the method further includes a step (g) of applying an etching process for removing a top portion of the substrate from the contact openings for providing a source contact area of lower contact resistance. In a preferred embodiment, the step (f) of performing a high energy body dopant implant to form a self-aligned deep body dopant region is a step of applying a channeling-effect implant by performing the high energy body dopant implant without an implant oxide layer. In a preferred embodiment, the step (f) of performing a high energy body dopant implant to form a self-aligned deep body dopant region is a step of applying a channeling-effect implant by performing the high energy body dopant implant at an implant angle of less than seven degrees from a perpendicular direction to a top surface of the substrate. In a preferred embodiment, the step (f) of performing a high energy body dopant implant to form a self-aligned deep body dopant region is a step of applying a channeling-effect implant by performing the high energy body dopant implant at an implant angle of zero degrees from a perpendicular direction to a top surface of the substrate. In a preferred embodiment, the step (f) is a step of applying the channeling-effect implant by skipping an implant oxide layer formation process and by performing the high energy body dopant implant at an implant angle of seven degrees from a perpendicular direction to a top surface of the substrate.

Figure 6:
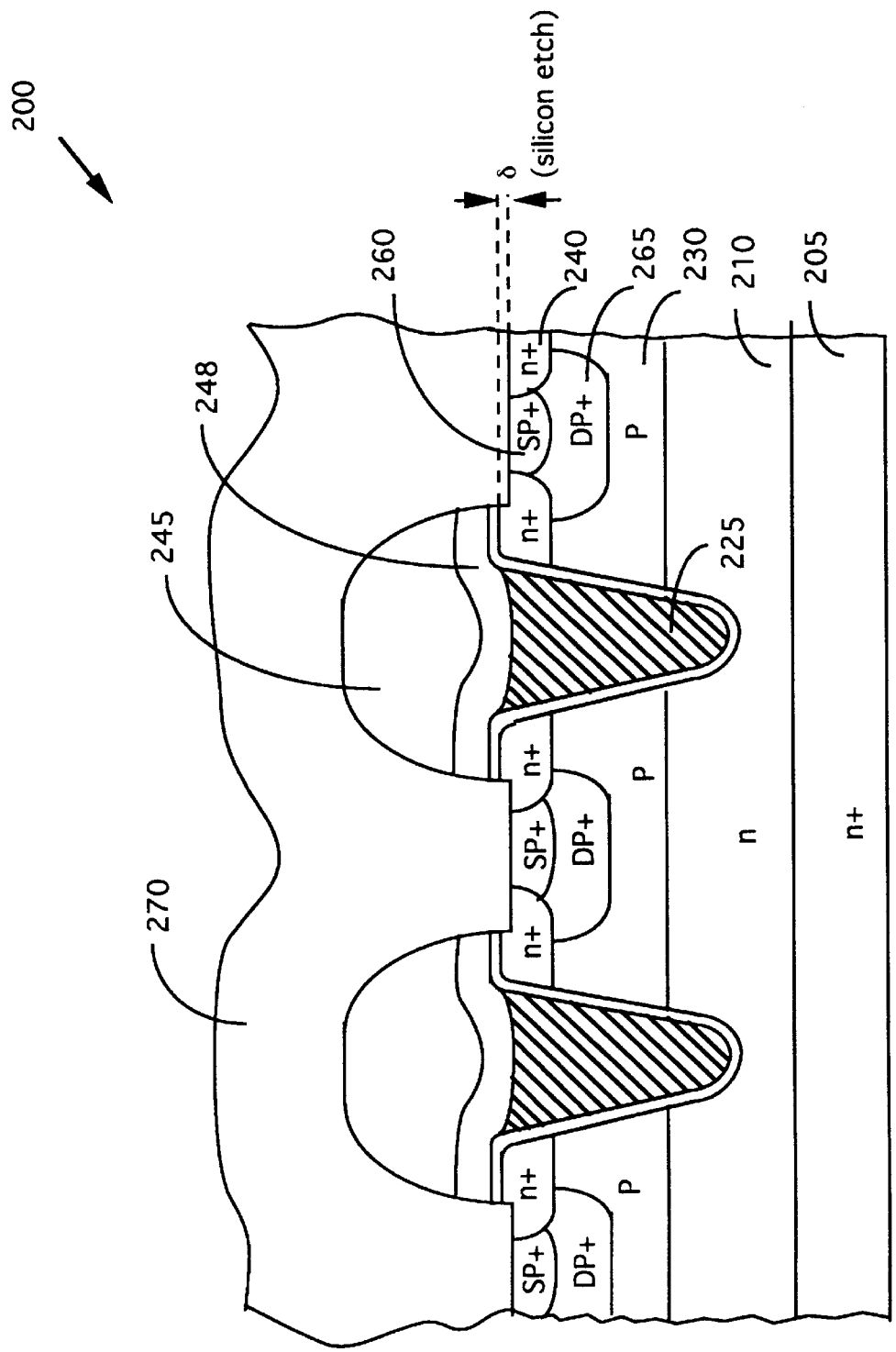
FIG. 6 is a cross section view of a trenched MOSFET device of the present invention.

Referring to FIG. 6 for a trenched MOSFET device 200 which is manufactured by a similar process as described above to have a shallow p+ region 260 and a deep p+ region 265 in the p-body region 230 formed in the substrate between the trenched gate 225. The deep p+ region is formed beneath the source region 240 and are formed by a high energy body dopant implant through the contact openings between the first insulation layer 248 and the second insulation layer 245. The deep p+ region 265 and the shallow p+ regions are formed as self aligned regions with the insulation layers 248 and 245 serving as body dopant implant blocks. Because of the thickness of these insulation layers, the deep body doped regions 265 are prevented from being laterally diffused to contact the channels. There is no adverse effect to the threshold voltage caused by a contact of the deep p+ region with the channels because a greater distance of the deep body doped region is maintained with the first and second insulation layers 248 and 245 which block the body dopant ions to come dose to the channel regions next to the trenched gates 225 adjacent to the source regions 240.

Therefore, the present invention provides a new and improved MOSFET cell structure, and fabrication process to form the self aligned deep and shallow high concentration body-dopant regions to improve the device ruggedness and to remove a top portion of the lightly doped source region to reduce the contact resistance whereby the limitations and difficulties of the prior art are resolved. Specifically, a new and improved MOSFET manufacture process and cell structure are disclosed wherein the shallow and deep body implant operations are performed after the contact opening process with the thick insulation layers covering the gates employed as ion-blocks for body implants to form the self-aligned deep and shallow high concentration body regions and followed by removing the lightly doped surface portion in the contact openings whereby the contact resistance is reduced. With the thick insulation layers covering the gates employed as ion-blocks for body implants to form the self-aligned deep and shallow high concentration body regions, the high energy ion implant to form the deep high concentration body region is performed either without an implant oxide layer or with an implant angle less than seven degrees (7°) whereby a channeling-enhanced body dopant profile at the lower portion of the body region is formed which further improve the device ruggedness. Since the shallow and deep body high concentration implant operations are performed after the contact opening process with the thick insulation layers covering the gates employed as ion-blocks for body implants, self-aligned deep and shallow body regions are formed without the requirements of additional masks or sidewall spacers as that employed in the prior art, and higher product quality and reliability can be achieved with this simplified manufacture process. Furthermore, the shallow and deep body implant operations are performed after the contact opening process with the thick insulation layers covering the gates employed as ion-blocks, the deep high concentration body-dopant regions are kept at a certain lateral distance away from the channel regions by taking advantage of the thickness of the insulation layers applied as ion blocks whereby the concerns of threshold voltage increase caused by lateral diffusion of the body dopant from the deep high concentration body dopant regions to the channel regions as that encountered in the prior art are eliminated.

Although the present invention has been described in terms of the presently preferred embodiment, it is to be understood that such disclosure is not to be interpreted as limiting. Various alternations and modifications will no doubt become apparent to those sdilled in the art after reading the above disclosure. Accordingly, it is intended that the appended claims be interpreted as covering all alternations and modifications as fall within the true spirit and scope of the invention.

We claim:

1. A method for fabricating a MOSFET transistor on a substrate comprising steps of:
    a) forming an epi-layer of a first conductivity type as a drain region in said substrate and then growing an initial oxide layer over said epi-layer;
    (b) applying an active mask for etching said active layer to define an active area followed by depositing an overlaying polysilicon layer thereon and applying a polysilicon mask for etching said polysilicon layer to define a plurality of polysilicon gates;
    (c) removing said polysilicon mask then carrying out a body implant of a second conductivity type followed by performing a body diffusion for forming a plurality of body regions;
    (d) applying a source blocking mask for implanting a plurality of source regions in said body regions with ions of said first conductivity type followed by removing said source blocking mask and a source diffusion process;
    (e) forming an overlying insulation layer covering said MOSFET device followed by applying a contact mask to open a plurality of contact openings there-through; and
    (f) performing a low energy body-dopant implant and high energy body dopant implant to form a self-aligned shallow high concentration body dopant region and a self-aligned deep high concentration body dopant region.

2. The method for fabricating said MOSFET transistor of claim 1 wherein:
    after forming said self-aligned shallow high concentration body-dopant region and said self-aligned deep high concentration body-dopant region, said step (f) further includes a step of applying a high temperature process for densffication of said insulation layer and for activating a diffusion of said deep and shallow high concentration body dopant regions.

3. The method for fabricating said MOSFET transistor of claim 1 further comprising:
    (g) applying an etching process for removing a top portion of said substrate from said contact openings for providing a source contact area of lower contact resistance.

4. The method for fabricating said MOSFET transistor of claim 1 wherein:
    said step (f) of performing a high energy body dopant implant to form a self-aligned deep body dopant region is a step of applying a channeling-effect implant by performing said high energy body dopant implant without an implant oxide layer.

5. The method for fabricating said MOSFET transistor of claim 1 wherein:
    said step (f) of performing a high energy body dopant implant to form a self-aligned deep body dopant region is a step of applying a channeling-effect implant by performing said high energy body dopant implant at an implant angle of less than seven degrees from a perpendicular direction to a top surface of said substrate.

6. The method for fabricating said MOSFET transistor of claim 5 wherein:
    said step (f) of performing a high energy body dopant implant to form a self-aligned deep body dopant region is a step of applying a channeling-effect implant by performing said high energy body dopant implant at an implant angle of zero degrees from a perpendicular direction to a top surface of said substrate.

7. The method for fabricating said MOSFET transistor of claim 4 wherein:
    said step (f) is a step of applying said channeling-effect implant by skipping an implant oxide layer formation process and by performing said high energy body dopant implant at an implant angle of seven degrees from a perpendicular direction to a top surface of said substrate.

* * * * *